(12) United States Patent
Choi et al.

(10) Patent No.: US 7,670,534 B2
(45) Date of Patent: *Mar. 2, 2010

(54) METHOD TO CONTROL AN ATMOSPHERE BETWEEN A BODY AND A SUBSTRATE

(75) Inventors: Yeong-Jun Choi, Cedar Park, TX (US); Byung-Jin Choi, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 1095 days.

This patent is subject to a terminal disclaimer.

(21) Appl. No.: 11/231,580

(22) Filed: Sep. 21, 2005

(65) Prior Publication Data

US 2007/0063384 A1    Mar. 22, 2007

(51) Int. Cl.
B28B 11/00 (2006.01)
C23F 1/00 (2006.01)
B41C 1/06 (2006.01)

(52) U.S. Cl. .......................... 264/320; 264/85; 264/319; 264/293; 425/385; 425/411

(58) Field of Classification Search .................. 264/320, 264/85, 319, 293; 425/385, 411
See application file for complete search history.

(56) References Cited

U.S. PATENT DOCUMENTS

| 4,279,628 A | 7/1981 | Wymer et al. |
| 4,512,848 A | 4/1985 | Deckman et al. |
| 4,521,175 A | 6/1985 | Medwed |
| 4,689,004 A | 8/1987 | Hunkel |
| 4,731,155 A | 3/1988 | Napoli et al. |
| 4,767,584 A | 8/1988 | Siler |
| 4,848,911 A | 7/1989 | Uchida et al. |
| 4,959,252 A | 9/1990 | Bonnebat et al. |
| 5,028,366 A | 7/1991 | Harakal et al. |
| 5,110,514 A | 5/1992 | Soane |
| 5,148,037 A | 9/1992 | Suda et al. |
| 5,151,754 A | 9/1992 | Ishibashi et al. |

(Continued)

FOREIGN PATENT DOCUMENTS

JP        1-196749        8/1989

(Continued)

OTHER PUBLICATIONS

Johnson et al., Advances in Step and Flash Imprint Lithography, SPIE Microlithography Conference Feb. 23, 2003.

(Continued)

*Primary Examiner*—Joseph S Del Sole
*Assistant Examiner*—Nahida Sultana
(74) *Attorney, Agent, or Firm*—Laura C. Robinson

(57) ABSTRACT

The present invention is directed towards a method of controlling an atmosphere about a substrate, the method including, inter alia, positioning a body a distance from a surface of the substrate, the body having a wall coupled thereto placed in a position to create a flow resistance of a fluid between first and second regions of the substrate; and altering the position of the wall such that when a magnitude of the distance between the body and the surface of the substrate is decreased, a probability of the wall contacting the substrate is minimized.

20 Claims, 3 Drawing Sheets

U.S. PATENT DOCUMENTS

| | | |
|---|---|---|
| 5,240,550 A | 8/1993 | Boehnke et al. |
| 5,259,926 A | 11/1993 | Kuwabara et al. |
| 5,338,177 A | 8/1994 | LeTouche |
| 5,362,940 A | 11/1994 | MacDonald et al. |
| 5,371,822 A | 12/1994 | Horwitz et al. |
| 5,425,848 A | 6/1995 | Haisma et al. |
| 5,480,047 A | 1/1996 | Tanigawa et al. |
| 5,512,131 A | 4/1996 | Kumar et al. |
| 5,545,367 A | 8/1996 | Bae et al. |
| 5,601,641 A | 2/1997 | Stephens |
| 5,669,303 A | 9/1997 | Maracas et al. |
| 5,694,961 A | 12/1997 | Begemann et al. |
| 5,772,905 A | 6/1998 | Chou |
| 5,776,748 A | 7/1998 | Singhvi et al. |
| 5,812,629 A | 9/1998 | Clauser |
| 5,820,769 A | 10/1998 | Chou |
| 5,821,175 A | 10/1998 | Engelsberg |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,948,470 A | 9/1999 | Harrison et al. |
| 5,956,216 A | 9/1999 | Chou |
| 5,974,150 A | 10/1999 | Kaish et al. |
| 5,997,963 A | 12/1999 | Davison et al. |
| 6,046,056 A | 4/2000 | Parce et al. |
| 6,074,827 A | 6/2000 | Nelson et al. |
| 6,099,771 A | 8/2000 | Hudkins et al. |
| 6,159,400 A | 12/2000 | Laquer |
| 6,218,316 B1 | 4/2001 | Marsh |
| 6,257,866 B1 | 7/2001 | Fritz et al. |
| 6,274,294 B1 | 8/2001 | Hines |
| 6,309,580 B1 | 10/2001 | Chou |
| 6,326,627 B1 | 12/2001 | Putvinski et al. |
| 6,334,960 B1 | 1/2002 | Willson et al. |
| 6,348,999 B1 | 2/2002 | Summersgill et al. |
| 6,355,198 B1 | 3/2002 | Kim et al. |
| 6,391,217 B2 | 5/2002 | Schaffer et al. |
| 6,416,311 B1 | 7/2002 | Springer et al. |
| 6,461,524 B1 | 10/2002 | Tsuihiji et al. |
| 6,482,742 B1 | 11/2002 | Chou |
| 6,498,640 B1 | 12/2002 | Ziger |
| 6,517,977 B2 | 2/2003 | Resnick et al. |
| 6,517,995 B1 | 2/2003 | Jacobson et al. |
| 6,518,189 B1 | 2/2003 | Chou |
| 6,580,172 B2 | 6/2003 | Mancini et al. |
| 6,621,960 B2 | 9/2003 | Wang et al. |
| 6,646,662 B1 | 11/2003 | Nebashi et al. |
| 6,678,038 B2 | 1/2004 | Binnard |
| 6,696,220 B2 | 2/2004 | Bailey et al. |
| 6,713,238 B1 | 3/2004 | Chou et al. |
| 6,764,386 B2 | 7/2004 | Uziel |
| 6,776,094 B1 | 8/2004 | Whitesides et al. |
| 6,809,356 B2 | 10/2004 | Chou |
| 6,828,244 B2 | 12/2004 | Chou |
| 6,849,558 B2 | 2/2005 | Schaper |
| 6,869,890 B2 | 3/2005 | Noji et al. |
| 6,873,087 B1 | 3/2005 | Choi et al. |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 6,916,585 B2 | 7/2005 | Sreenivasan et al. |
| 6,932,934 B2 | 8/2005 | Choi et al. |
| 6,946,360 B2 | 9/2005 | Chou |
| 6,955,767 B2 | 10/2005 | Chen |
| 6,964,793 B2 | 11/2005 | Willson et al. |
| 6,982,783 B2 | 1/2006 | Choi et al. |
| 7,019,819 B2 | 3/2006 | Choi et al. |
| 7,077,992 B2 | 7/2006 | Sreenivasan et al. |
| 7,090,716 B2* | 8/2006 | McMackin et al. ............ 95/246 |
| 7,117,583 B2 | 10/2006 | Dinan et al. |
| 7,128,875 B2 | 10/2006 | Cubicciotti |
| 7,270,533 B2 | 9/2007 | McMackin et al. |
| 7,316,554 B2* | 1/2008 | Choi et al. .................. 425/210 |
| 2002/0018190 A1 | 2/2002 | Nogawa et al. |
| 2002/0042027 A1 | 4/2002 | Chou et al. |
| 2002/0132482 A1 | 9/2002 | Chou |
| 2002/0167117 A1 | 11/2002 | Chou |
| 2002/0168578 A1 | 11/2002 | Wang et al. |
| 2002/0170880 A1 | 11/2002 | Chen |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0137494 A1 | 7/2003 | Tulbert |
| 2003/0174435 A1 | 9/2003 | Dinan et al. |
| 2003/0186140 A1 | 10/2003 | Fries |
| 2004/0036201 A1 | 2/2004 | Chou et al. |
| 2004/0046271 A1* | 3/2004 | Watts .................. 264/1.25 |
| 2004/0046288 A1 | 3/2004 | Chou |
| 2004/0110856 A1 | 6/2004 | Young et al. |
| 2004/0118809 A1 | 6/2004 | Chou et al. |
| 2004/0129293 A1 | 7/2004 | Eichenberger |
| 2004/0131718 A1 | 7/2004 | Chou et al. |
| 2004/0132301 A1* | 7/2004 | Harper et al. ............... 438/689 |
| 2004/0137734 A1 | 7/2004 | Chou et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0200368 A1* | 10/2004 | Ogino et al. .................. 101/34 |
| 2004/0219249 A1* | 11/2004 | Chung et al. ................ 425/385 |
| 2004/0250945 A1 | 12/2004 | Zheng et al. |
| 2005/0037143 A1 | 2/2005 | Chou et al. |
| 2005/0064054 A1* | 3/2005 | Kasumi ..................... 425/112 |
| 2005/0072755 A1* | 4/2005 | McMackin et al. ............ 216/44 |
| 2005/0072757 A1* | 4/2005 | McMackin et al. ............ 216/83 |
| 2006/0062867 A1 | 3/2006 | Choi et al. |
| 2006/0076717 A1 | 4/2006 | Sreenivasan et al. |
| 2006/0077374 A1 | 4/2006 | Sreenivasan et al. |
| 2007/0065532 A1 | 3/2007 | Choi et al. |
| 2007/0114686 A1 | 5/2007 | Choi et al. |
| 2007/0243279 A1* | 10/2007 | McMackin et al. .......... 425/385 |

FOREIGN PATENT DOCUMENTS

| | | |
|---|---|---|
| JP | 02-24848 | 1/1990 |
| JP | 02-92603 | 4/1990 |
| JP | 02192045 | 7/1990 |
| WO | WO 87/02935 | 5/1987 |
| WO | WO 99/05724 | 2/1999 |
| WO | WO 00/21689 | 4/2000 |
| WO | WO 01/47003 | 6/2001 |

OTHER PUBLICATIONS

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

Xia et al., Soft Lithography, Angew. Chem. Int. Ed., pp. 550-575 Jan. 1, 1998.

Chou et al., Imprint Lithography with Sub-10 nm Feature Size and High Throughput, Microelectronic Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Chou et al., Imprint of Sub-25 nm Vias and Trenches in Polymers, Appl. Phys. Lett. 67 (21) Nov. 20, 1995.

Nguyen, Asymmetric Fluid-Structure Dynamics in Nanoscale Imprint Lithography, The University of Texas at Austin, pp. 1-111 Aug. 1, 2001.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Abstract of Japanese Patent 02-92603, Aug. 12, 2004.

Translation of Japanese Patent 02-92603, Apr. 3, 1990.

Translation of Japanese Patent 02-24848, Jan. 26, 1990.

Abstract of Japanese Patent 02-24848, Jan. 26, 1990.

Chou et al., Ultrafast and Direct Imprint of Nanostructures in Silicon, Nature, Col. 417, (Jun. 2002), pp. 835-837 Jun. 1, 2002.

Chou et al., Nanoimprint Lithography, Journal of Vacuum Science Technolgoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology. vol. b. 19(6) Nov. 1, 2001.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

Schneider et al., Stripes of Partially Fluorinated Alkyl Chains: Dipolar Langmuir Monolayers, J. Chem. Phys. vol. 122, Issue 9 Mar. 1, 2005.

Colburn et al., Dissertation for the Degree of Doctor of Philosophy, Step and Flash Imprint Lithography: A Low-Pressure, Room-Temperature Nanoimprint Lithography Aug. 1, 2001.

U.S. Appl. No. 11/695,263, naming Inventors Cherala et al., entitled Partial Vacuum Environment Imprinting, filed Apr. 2, 2007.

U.S. Appl. No. 11/749,909, naming Inventors Choi et al., entitled Method for Expelling Gas Positioned Between a Substrate and a Mold, filed May 17, 2007.

Abstract of Japanese patent 02-192045, Jul. 27, 1990.

* cited by examiner

METHOD TO CONTROL AN ATMOSPHERE BETWEEN A BODY AND A SUBSTRATE

CROSS-REFERENCE TO RELATED PATENT APPLICATIONS

The present application related in subject matter to U.S. patent application Ser. No. 11/231,616, filed Sep. 21, 2005 and entitled "System to Control an Atmosphere Between a Body and a Substrate," and listing Yeong-Jun Choi and Byung-Jin Choi as inventors, the entirety of which is incorporated by reference herein.

BACKGROUND OF THE INVENTION

The field of the invention relates generally to micro-fabrication techniques. More particularly, the present invention is directed to a system of controlling an atmosphere between a mold and a substrate.

Nano-fabrication involves the fabrication of very small structures, e.g., having features on the order of nano-meters or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publication 2004/0065976 filed as U.S. patent application Ser. No. 10/264,960, entitled, "Method and a Mold to Arrange Features on a Substrate to Replicate Features having Minimal Dimensional Variability"; United States patent application publication 2004/0065252 filed as U.S. patent application Ser. No. 10/264,926, entitled "Method of Forming a Layer on a Substrate to Facilitate Fabrication of Metrology Standards"; and U.S. Pat. No. 6,936,194, entitled "Functional Patterning Material for Imprint Lithography Processes," all of which are assigned to the assignee of the present invention.

The fundamental imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a motion stage to obtain a desired position to facilitate patterning thereof. To that end, a template is employed spaced-apart from the substrate with a formable liquid present between the template and the substrate. The liquid is solidified to form a solidified layer that has a pattern recorded therein that is conforming to a shape of the surface of the template in contact with the liquid. The template is then separated from the solidified layer such that the template and the substrate are spaced-apart. The substrate and the solidified layer are then subjected to processes to transfer, into the substrate, a relief image that corresponds to the pattern in the solidified layer.

United States patent application publication 2005/0074512 filed as U.S. patent application Ser. No. 10/898,037 entitled "System for Creating a Turbulent Flow of Fluid between a Mold and a Substrate" describes a system for introducing a flow of a fluid between a mold and a substrate. More specifically, the system includes a baffle coupled to a chuck, the baffle having first and second apertures in communication with a fluid supply to create a turbulent flow of the fluid between the mold and the substrate.

To that end, it may be desired to provide an improved system of controlling the atmosphere between a mold and a substrate.

SUMMARY OF THE INVENTION

The present invention is directed towards a method of controlling an atmosphere about a substrate, the method including, inter alia, positioning a body a distance from a surface of the substrate, the body having a wall coupled thereto placed in a position to create a flow resistance of a fluid between first and second regions of the substrate; and altering the position of the wall such that when a magnitude of the distance between the body and the surface of the substrate is decreased, a probability of the wall contacting the substrate is minimized. These and other embodiments are described more fully below.

DETAILED DESCRIPTION OF THE INVENTION

Figure 1:
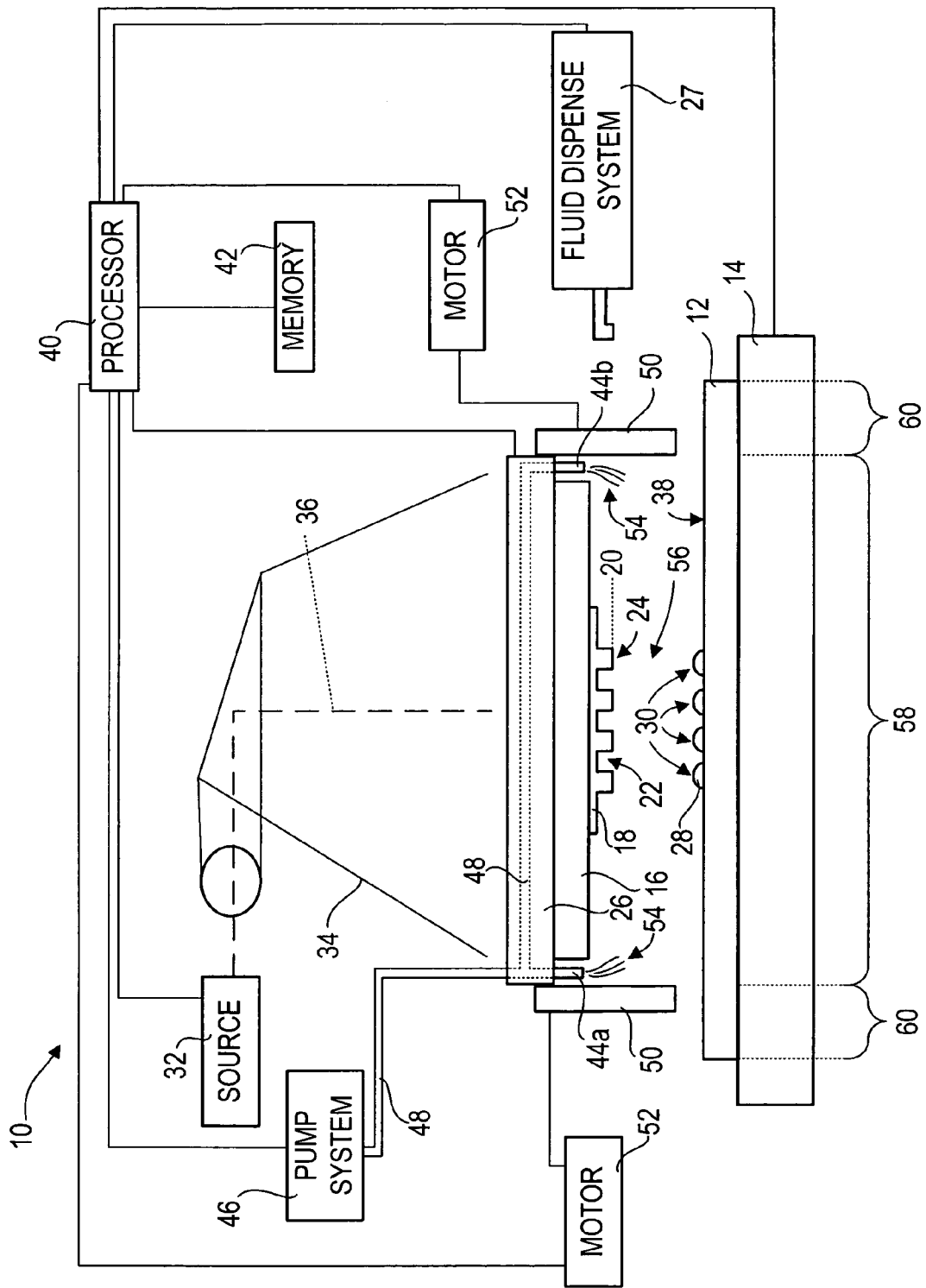
FIG. 1 is a simplified side view of a lithographic system having walls coupled to an imprint head.

A system 10 employed to form a relief pattern in a substrate 12 includes a stage 14 upon which substrate 12 is supported, and a template 16 having a mold 18 with a patterning surface 20 thereon. In a further embodiment, substrate 12 may be coupled to a substrate chuck (not shown), the substrate chuck (not shown) being any chuck including, but not limited to, vacuum and electromagnetic.

Template 16 and/or mold 18 may be formed from such materials including but not limited to, fused-silica, quartz, silicon, organic polymers, siloxane polymers, borosilicate glass, fluorocarbon polymers, metal, and hardened sapphire. As shown, patterning surface 20 comprises features defined by a plurality of spaced-apart recessions 22 and protrusions 24. However, in a further embodiment, patterning surface 20 may be substantially smooth and/or planar. The plurality of features of patterning surface 20 defines an original pattern that forms the basis of a pattern to be formed on substrate 12.

Template 16 may be coupled to an imprint head 26 to facilitate movement of template 16, and therefore, mold 18. In a further embodiment, template 16 may be coupled to a template chuck (not shown), the template chuck (not shown) being any chuck including, but not limited to, vacuum and electromagnetic. A fluid dispense system 27 is coupled to be selectively placed in fluid communication with substrate 12 so as to deposit a polymerizable material 28 thereon. It should be understood that polymerizable material 28 may be deposited using any known technique, e.g., spin-coating, dip coating, chemical vapor deposition (CVD), physical vapor deposition (PVD), and the like. In the present example, however, polymerizable material 28 is deposited as a plurality of spaced-apart discrete droplets 30 on substrate 12.

A source 32 of energy 34 is coupled to direct energy 34 along a path 36. Imprint head 26 and stage 14 are configured to arrange mold 18 and substrate 12, respectively, to be in superimposition, and disposed in path 36. Either imprint head 26, stage 14, or both vary a distance between mold 18 and substrate 12 to define a desired volume therebetween that is filled by polymerizable material 28.

Typically, polymerizable material 28 is disposed upon substrate 12 before the desired volume is defined between mold 18 and substrate 12. However, polymerizable material 28 may fill the volume after the desired volume has been obtained. After the desired volume is filled with polymerizable material 28, source 32 produces energy 34, which causes polymerizable material 28 to solidify and/or cross-link, forming a polymeric material conforming to the shape of a surface 38 of substrate 12 and patterning surface 20 of mold 18. Control of this process is regulated by processor 40 that is in data communication with stage 14, imprint head 26, fluid dispense system 27, and source 32, operating on a computer-readable program stored in memory 42.

System 10 further comprises a pair of conduits 44a and 44b. As shown, conduits 44a and 44b are coupled to imprint head 26; however, conduits 44a and 44b may be coupled to any part of system 10, i.e., substrate 12, stage 14, template 16, the substrate chuck (not shown), or the template chuck (not shown). Further, system 10 may comprise any number of conduits. Conduits 44a and 44b may be in fluid communication with a pump system 46 via throughways 48. As shown, throughways 48 are contained within imprint head 26. However, in a further embodiment, throughways 48 may be positioned anywhere throughout system 10 and may be coupled to any part of system 10, i.e., substrate 12, stage 14, template 16, the substrate chuck (not shown), or the template chuck (not shown). Pump system 46 may be in communication with processor 40 operating on memory 42 to control an introduction/evacuation of a fluid 54 in an atmosphere 56 defined between mold 18 and droplets 30, described further below.

Further, system 10 comprises walls 50 coupled to imprint head 26. In a further embodiment, walls 50 may be coupled to any part of system 10, i.e., substrate 12, stage 14, template 16, the substrate chuck (not shown), or the template chuck (not shown). Walls 50 may be positioned at an interface between first and second regions 58 and 60 of substrate 12, with first region 58 being in superimposition with mold 18 and droplets 30. Further, walls 50 may substantially surround imprint head 26, and therefore, atmosphere 56. However, for simplicity of illustration, walls 50 are shown surrounding a portion of imprint head 26 and atmosphere 56.

Walls 50 may be in communication with a motor 52, with motor 52 controlling a motion thereof. For simplicity of illustration, motor 52 is shown as two separate bodies. Motor 52 may comprise a solenoid selected from a group of solenoids including but not limited to, electric, pneumatic, and hydraulic. Further, motor 52 may be employed without feedback. Motor 52 may be in communication with processor 40 operating on memory 42.

As mentioned above, during imprinting, template 16 and therefore, mold 18, are brought into proximity with substrate 12 before positioning polymerizable material 28 in droplets 30 upon substrate 12. Specifically, template 16 is brought within hundreds of microns of substrate 12, e.g., approximately 200 microns. It has been found desirable to perform localized control of atmosphere 56 that is proximate to both template 16 and substrate 12. For example, to avoid the deleterious effects of gases and/or gas pockets present in polymerizable material 28 in droplets 30 and/or subsequently trapped in a patterned layer, described further below, formed from droplets 30, it has been found beneficial to control desired properties of atmosphere 56 and/or the pressure of atmosphere 56. More specifically, it may be desired to control fluid 54 within atmosphere 56. To that end, a system and a method to facilitate control of atmosphere 56 is described below.

Figure 2:
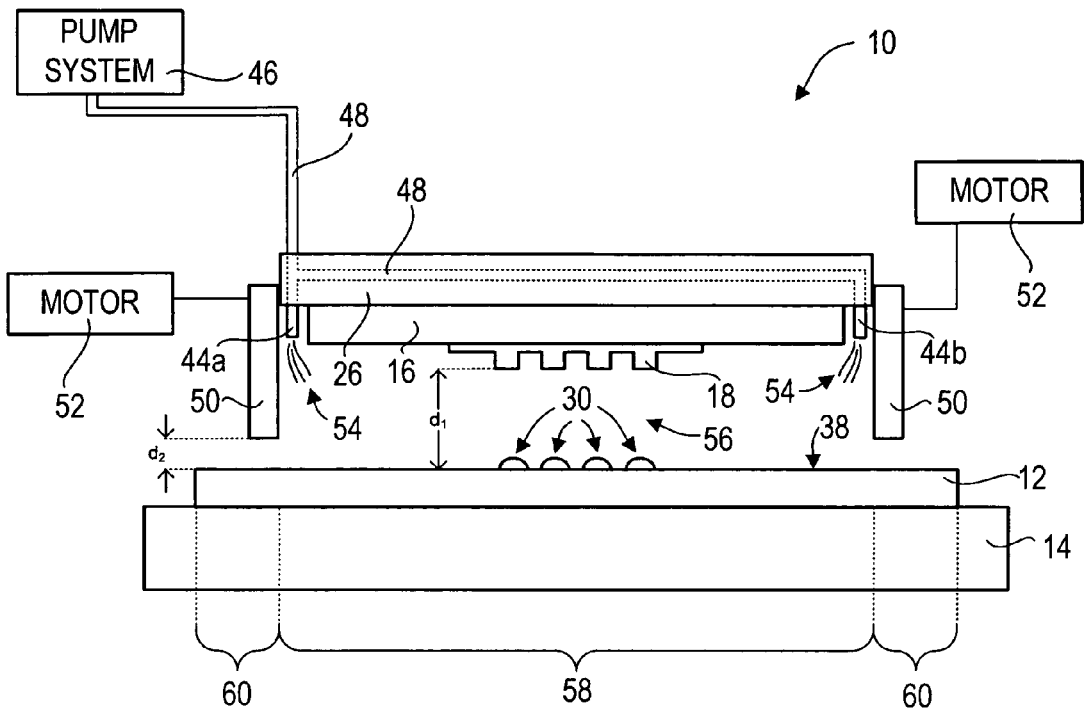
FIG. 2 is a side view of a portion of the system shown in FIG. 1, with the walls placed in a first position.

Referring to FIG. 2, a portion of system 10 is shown. More specifically, mold 18 is shown spaced-apart from surface 38 of substrate 12 a first distance '$d_1$'. Distance '$d_1$' may be on the order of hundreds of microns, i.e., approximately 200 to 300 microns. Walls 50 of system 10 are shown placed in a first position spaced-apart a distance '$d_2$' from surface 38 of substrate 12. Distance '$d_2$' may be on the order of tens of microns, i.e., approximately 50 microns.

Pump system 46 may introduce fluid 54 into atmosphere 56 through throughways 48 and conduits 44a and 44b. Fluid 54 may comprise a gas selected from a group of gases including, but not limited to, helium, hydrogen, nitrogen, carbon dioxide, and xenon. Fluid 54 may be introduced into atmosphere 56 through conduits 44a and 44b employing any desired method. For example, fluid 54 may be introduced through both conduits 44a and 44b concurrently, or sequentially pulsed through the same, i.e., first fluid is introduced through conduit 44a and subsequently through conduit 44b and then again through conduit 44b, with the process being repeated for a desired time or during the entire imprinting process. Methods for introduction/evacuation of fluid 54 through conduits 44a and 44b is disclosed in United States patent application publication 2005/0072755 filed as U.S. patent application Ser. No. 10/677,639 entitled "Single Phase Fluid Imprint Lithography Method," which is incorporated by reference herein in its entirety. In an example, conduits 44a and 44b may introduce fluid 54 within atmosphere 56 at a flow rate of 9 liters/minute.

To that end, it may be desired to control atmosphere 56, and more specifically, it may be desired to maintain fluid 54 within atmosphere 56 preceding to and until contact between mold 18 and polymerizable material 28 in droplets 30. In a further embodiment, it may be desired to maintain fluid 54 within atmosphere 56 prior to and subsequent to contact between mold 18 and polymerizable material 28 in droplets 30. In an example, it may be desired to have atmosphere 56 comprise more than a 95% mass fraction of fluid 54 therein. To that end, walls 50 facilitate control of atmosphere 56 by creating a flow resistance between first and second regions 58 and 60 of substrate 12. More specifically, as mentioned above, walls 50 are spaced-apart a distance '$d_2$' from surface 38 of substrate 12; and mold 18, in superimposition with polymerizable material 28 in droplets 30, is spaced-apart a distance '$d_1$' from surface 38 of substrate 12. Further, distance '$d_1$' is substantially greater than distance '$d_2$'. As a result, a greater resistance to a flow of fluid 54 is established between walls 50 and surface 38 of substrate 12 than between mold 18 and surface 38 of substrate 12; and thus, fluid 54 may tend to be maintained within atmosphere 56, which may be desired. For a given flow rate of fluid 54 through conduits 44a and 44b and a given volume of atmosphere 56, the distance '$d_2$' may be selected to achieve a desired resistance to the flow of fluid 54 between first and second regions 58 and 60 of substrate 12.

However, as mentioned above, a desired volume is defined between mold 18 and substrate 12 that is filled by polymerizable material 28 in droplets 30. More specifically, imprint head 26 may position mold 18 such that polymerizable material 28 in droplets 30 are in contact therewith. As a result, walls 50 may translate to minimize a probability of the same contacting substrate 12 during a decrease in a magnitude of distance '$d_1$', and more specifically, during contact of mold 18 with polymerizable material 28 in droplets 30. Contact of substrate 12 by walls 50 may result in, inter alia, structural comprise of system 10, impedance of contact between mold 18 and droplets 30, misalignment of mold 18 with respect to substrate 12, and damage to substrate 12 and/or mold 18, all of which are undesirable.

Figure 3:
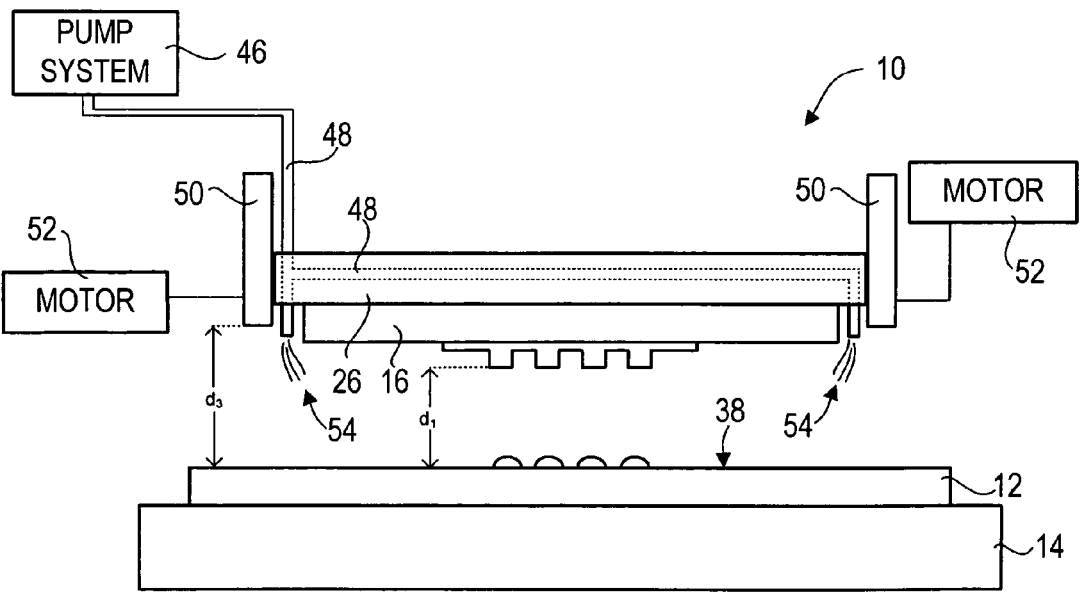
FIG. 3 is a side view of a portion of the system shown in FIG. 1, with the walls placed in a second position.

Referring to FIG. 3, to that end, walls 50 may translate in a first direction away from substrate 12. More specifically, motor 52 may position walls 50 such that the same are positioned a distance '$d_3$' from surface 38 of substrate 12, with distance '$d_3$' being greater than distance '$d_1$'. Distance '$d_3$' may be on the order of hundreds of microns.

Figure 4:
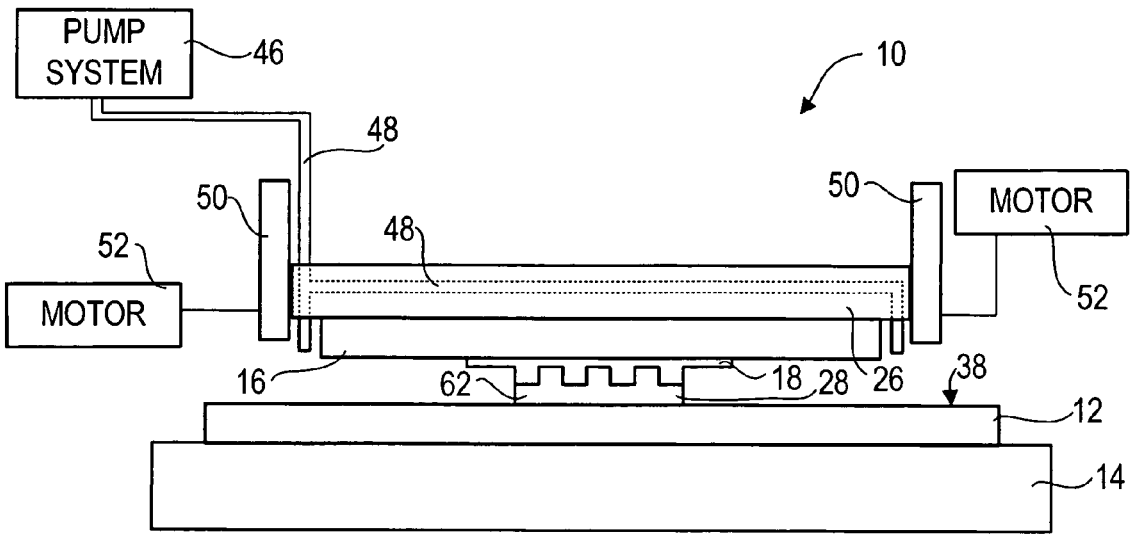
FIG. 4 is a side view of a portion of the lithographic system shown in FIG. 1, with a template in contact with a material on a substrate.

Referring to FIG. 4, mold 18 is shown in mechanical contact with polymerizable material 28, spreading droplets 30, shown in FIG. 1, so as to generate a contiguous formation 62 of polymerizable material 28 over surface 38 of substrate 12. Template 16, and further, mold 18, may translate in a second direction towards substrate 12, with the second direction being opposite to the aforementioned first direction. In a further embodiment, stage 14, and further, substrate 12 may translate in a third direction towards mold 18, with the third direction being in a direction substantially the same as the first direction. Furthermore, walls 50 may translate in the first direction concurrently or asynchronously with translation of mold 18 and/or substrate 12.

Referring to FIG. 1, in a preferred embodiment, fluid 54 may be introduced into atmosphere 56 at any time prior to contact between mold 18 and droplets 30. However, in a further embodiment, introduction of fluid 54 into atmosphere 56 may be ceased at any time.

Figure 5:
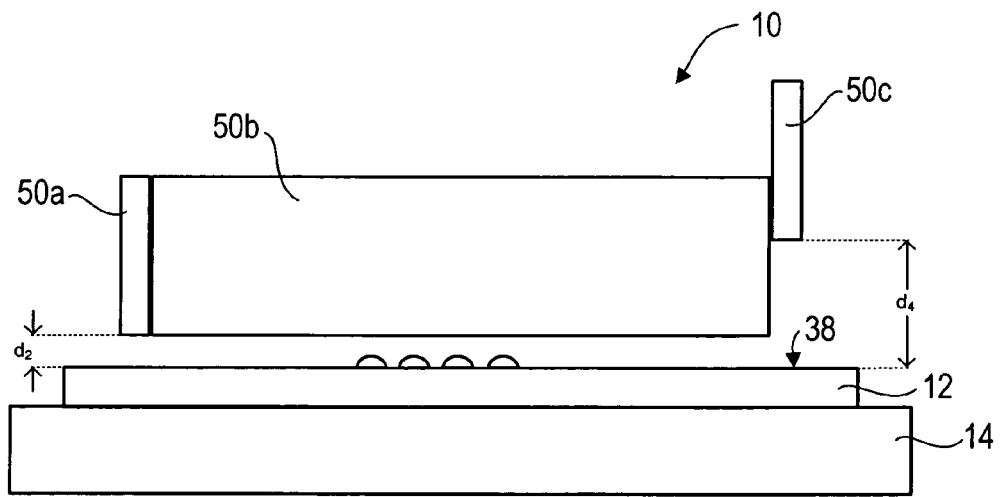
FIG. 5 is a side view of a portion of the lithographic system shown in FIG. 1, with the walls being positioned to expose a portion of an atmosphere between a template and a substrate to an ambient environment.

Referring to FIG. 5, in a preferred embodiment, it may be desired to expose a portion of atmosphere 56, shown in FIG. 1, to an ambient environment to facilitate control of fluid 54 within atmosphere 56, shown in FIG. 1. To that end, walls 50$a$ and 50$b$ may be positioned distance '$d_2$' from surface 38 of substrate 12, as mentioned above. However, wall 50$c$ may be positioned a distance '$d_4$' from surface 38 of substrate 12. Distance '$d_4$' may have a magnitude approximately between 200 microns and 1 millimeter. As a result, atmosphere 56 may be exposed to an ambient environment. In a further embodiment, walls 50 may substantially surround imprint head 26, and thus atmosphere 56, forming a chamber (not shown). The chamber (not shown) may be completely evacuated or pressurized.

Referring to FIG. 2, in a further embodiment, to increase a quantity of fluid 54 disposed within atmosphere 56, distance '$d_1$' may be increased prior to contact of mold 18 with droplets 30. More specifically, distance '$d_1$' may be on the order of millimeters, i.e., approximately 1 millimeter.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method of controlling an atmosphere about a substrate, said method comprising:
   positioning a body a first distance from a surface of said substrate, said body having a wall coupled thereto, said wall spaced-apart from said surface of said substrate a second distance and placed in a position to create a resistance to a flow of a fluid between first and second regions of said substrate; and
   increasing said magnitude of said second distance in response to a decrease in magnitude of said first distance between said body and said surface of said substrate such that a probability of said wall contacting said substrate is minimized.

2. The method as recited in claim 1 further including introducing said fluid between said substrate and said body.

3. The method as recited in claim 1 wherein increasing said magnitude of said second distance further includes translating said wall and decreasing said magnitude of said first distance concurrently.

4. The method as recited in claim 1 wherein increasing said magnitude of said second distance further includes translating said wall prior to decreasing said magnitude of said first distance.

5. The method as recited in claim 1 further Including translating said body in a direction towards said substrate.

6. The method as recited in claim 1 further including translating said substrate in a direction towards said body.

7. The method as recited in claim 1 further including surrounding a portion of said first region with said wall.

8. The method as recited in claim 1 further including exposing a portion of said substrate to an ambient environment.

9. A method of controlling an atmosphere about a substrate, said method comprising:
   positioning a body a first distance from a surface of said substrate, said body having a wall coupled thereto placed in a position, said wall positioned at a second distance from said surface of said substrate;
   introducing a fluid between said body and said substrate, said position of said wall creating a flow resistance of said fluid between first and second regions of said substrate to create said atmosphere about said first region; and
   increasing said magnitude of said second distance in response to a decrease in magnitude of said first distance between said body and said surface of said substrate such that a probability of said wall contacting said substrate is minimized.

10. The method as recited in claim 9 wherein increasing said magnitude of said second distance further includes translating said well and decreasing said magnitude of said first distance concurrently.

11. The method as recited in claim 9 wherein increasing said magnitude of said second distance further includes translating said wall prior to decreasing said magnitude of said first distance.

12. The method as recited in claim 9 further including translating said body in a direction towards said substrate.

13. The method as recited in claim 9 further including translating said substrate in a direction towards said body.

14. The method as recited in claim 9 further including surrounding a portion of said first region with said wall.

15. A method of controlling an atmosphere about a substrate having first and second regions, said method comprising:
   placing a body in superimposition with said first region and being spaced-apart from a surface of said substrate a first distance;
   introducing a fluid between said body and said substrate;
   positioning a wall, coupled to said body, at an interface of said first and second regions and further being spaced-apart from said surface a second distance differing from said first distance, with said first and second distances being established such that said fluid creates said atmosphere about said first region; and increasing said magnitude of said second distance in response to a decrease in magnitude or said first distance between said body and said surface of said substrate such that a probability of said wall contacting said substrate is minimized.

16. The method as recited in claim 15 wherein increasing said magnitude of said second distance further includes translating said wall and decreasing said magnitude of said first distance concurrently.

17. The method as recited in claim 15, wherein increasing said magnitude of said second distance further includes translating said wall prior to decreasing said magnitude of said first distance.

18. The method as recited in claim 2, wherein said fluid is a gas.

19. The method as recited in claim 9, wherein said fluid is a gas.

20. The method as recited in claim 15, wherein said fluid is a gas.

* * * * *